United States Patent
Kuhn et al.

(10) Patent No.: US 6,452,645 B1
(45) Date of Patent: Sep. 17, 2002

(54) MULTIPLE PRELIMINARY STAGE CIRCUIT FOR TELEVISION TUNER

(75) Inventors: Ralph Kuhn, Vaterstetten; Lothar Musiol, München, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/281,821

(22) Filed: Mar. 30, 1999

Related U.S. Application Data

(63) Continuation of application No. PCT/DE97/02232, filed on Sep. 29, 1997.

(51) Int. Cl.⁷ .............................. H04N 5/44; H04N 5/50
(52) U.S. Cl. ....................... 348/731; 348/725; 348/732; 348/733; 348/735
(58) Field of Search ................... 348/728, 731, 348/732, 733, 735; 455/180.1, 180.2, 188.1, 188.2; H04N 5/44, 5/50

(56) References Cited

U.S. PATENT DOCUMENTS

| | | | |
|---|---|---|---|
| 3,769,604 A | | 10/1973 | Atkinson ..................... 330/305 |
| 5,115,317 A | * | 5/1992 | Igarashi et al. ............. 348/731 |
| 5,204,645 A | * | 4/1993 | Hohmann ..................... 334/1 |
| 5,214,399 A | * | 5/1993 | Hohmann ..................... 334/1 |
| 5,821,838 A | * | 10/1998 | Suzukei et al. ................ 334/47 |
| 5,930,696 A | * | 7/1999 | Tzuang et al. .............. 348/725 |
| 6,160,572 A | * | 12/2000 | Matsuura ..................... 348/731 |

FOREIGN PATENT DOCUMENTS

| | | |
|---|---|---|
| DE | 40 41 345 A1 | 7/1991 |
| EP | 0 457 932 A1 | 11/1991 |
| EP | 0 457 934 A1 | 11/1991 |
| EP | 0 500 434 A1 | 8/1992 |
| EP | 0 556 644 B1 | 5/1998 |
| WO | WO-98/15055 | * 4/1998 |

OTHER PUBLICATIONS

Henning Hohmann et al.: "Integrierte Schaltungen für Fernseh–und Videorecorder–Tuner TUA 2017 und SDA 3302" [integrated circuits for TV and VCR tuner TUA 2017 and SDA 3302], Siemens Components, vol. 28, 1990, No. 2, pp. 65–69.

* cited by examiner

*Primary Examiner*—John Miller
*Assistant Examiner*—Linus H. Lo
(74) *Attorney, Agent, or Firm*—Laurence A. Greenberg; Werner H. Stemer; Ralph E. Locher

(57) ABSTRACT

The multiple preamplifier circuit for a television tuner has at least one first band with an amplification stage and a second band with an amplification stage. The amplification stage of the first band and the amplification stage of the second band are commonly integrated in a common chip for both bands. The band switching signal and an amplification control signal are applied directly to the common chip.

6 Claims, 6 Drawing Sheets

Prior Art

MULTIPLE PRELIMINARY STAGE CIRCUIT FOR TELEVISION TUNER

CROSS-REFERENCE TO RELATED APPLICATION

This is a continuation of copending International Application PCT/DE97/02232, filed Sep. 29, 1997, which designated the United States.

BACKGROUND OF THE INVENTION

Field of the Invention

The invention lies in the electronics field. Specifically, the present invention concerns a multiple preliminary stage circuit for a television tuner with at least a first band having an amplification stage and a second band having an amplification stage.

Television signals transmitted over a frequency range between about 50 and 850 MHz are generally processed in three bands of a television tuner namely UHF band, a VHF-HF1 band and a VHF2 band. However, it is also possible to combine the VHF1 band and the VHF2 band into a single VHF band so that the most cost-effective tuner concepts have a total of two bands.

A circuit configuration for range switching in tuners is known from U.S. Pat. No. 5,204,645 to Hohmann (European patent application EP-A-0 457 932). There, a MOS tetrode is used as an amplifier. The source terminals of the MOS tetrode are switchable via a control circuit between the two supply potentials 0 V and 5 V. Depending on the applied potential, the desired range is selected.

A two-band television tuner is shown in FIG. 5 as an example.

The television tuner depicted in FIG. 5 comprises a UHF band 1 and a VHF band 2. Depending on the frequency of the desired television signal, either the UHF or VHF band is activated (band switching). A television signal supplied via an antenna 3 is fed in band 1 or 2 initially to a preselection circuit 4 or 5 for crude adjustment. A controllable amplifier stage 6 and 7 is connected after these preselection circuits 4 and 5, in which the television signals are amplified as a function of the signal level. These amplification stages are implemented with dual gate MOS-FETs. These field-effect transistors can be readily adjusted to resonance circuits. They are described, for example, in the above-mentioned U.S. Pat. No. 5,204,645.

Band pass filters 8 and 9, at whose output a tuner-IC 10 converts the selected channel to the television line frequency with oscillators 11, 12, are connected after the amplifier stages 6 and 7.

Amplification control signals are fed to the two amplifier stages 6 and 7, which is shown by arrows 13 and are engaged in alternation with tuner-IC via a switching logic 30. These functions require significant discrete component expense.

SUMMARY OF THE INVENTION

It is accordingly an object of the invention to provide a two-band preliminary stage circuit for television tuners, which overcomes the above-mentioned disadvantages of the heretofore-known devices and methods of this general type and which is further simplified so that it can be designed more compact and get by with fewer components.

With the foregoing and other objects in view there is provided, in accordance with the invention, a multiple preliminary stage circuit for a television tuner, comprising:

a first band with a first band amplifier stage having a transistor and a second band with a second band amplifier stage having a transistor;

a common chip common to the first band and the second band and having integrated therein the first band amplifier stage and the second band amplifier stage;

the common chip having a terminal for receiving a band switching signal and a terminal for receiving an amplification control signal;

a tuner-IC connected to the common chip for switching, with a single band switching signal, the first and second amplifier stages;

a reference transistor connected to a respective transistor of a respective the amplifier stage to form a current mirror circuit; and a further transistor having a controlled section connected between the reference transistor and a reference potential for selectively blocking the controlled section of the reference transistor or connecting the controlled section through to the reference potential in dependence on the band switching signal, and wherein the respectively other amplifier stage is selectively activated and deactivated in complementary fashion via the band switching signal.

In other words, the object is satisfied with the integration of the two bands in a common chip, to which a band switching signal and an amplification control signal can be fed.

In the multiple preliminary stage circuit according to the invention the two amplifier stages of the existing two-band preliminary stage circuit are therefore accommodated on one chip so that circuit parts and housing terminals can be jointly utilized for both bands. It should be noted that the amplifier stages of more than two bands can also optionally be integrated in the one chip.

A first stage can then be assigned to the UHF band, whereas the second stage operates in the VHF band.

In accordance with an added feature of the invention, a reference transistor of the respectively other amplifier stage is short-circuited with the reference potential.

In accordance with an additional feature of the invention, the amplifier stages have control inputs shorted to the reference potential.

In accordance with another feature of the invention, the common chip further comprises at least one operating point adjustment circuit and a switching logic.

In accordance with a further feature of the invention, the operating point adjustment circuit comprises a current source, an auxiliary element, and the reference transistor in the current mirror circuit for the corresponding amplifier stage.

The chip therefore contains for each band an MOS-FET amplifier stage, in which all MOS-FET amplifier stages of one chip are switchable by only one band switching signal from a tuner-IC. In addition, the chip has at least one operating point adjustment circuit and a switching logic. The operating point adjustment circuit then consists of a current mirror circuit with a reference transistor lying on the MOS-FET amplifier stage. The band switching signal is fed to the switching logic, whereas the amplification control signal is fed to a second gate of an MOS-FET amplifier stage whose first gate is exposed to an input signal.

In accordance with a concomitant feature of the invention, the common chip is enclosed in an SMD housing (SMD= surface mounted device).

Other features which are considered as characteristic for the invention are set forth in the appended claims.

Although the invention is illustrated and described herein as embodied in a multiple preliminary stage circuit for television tuner, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 5:
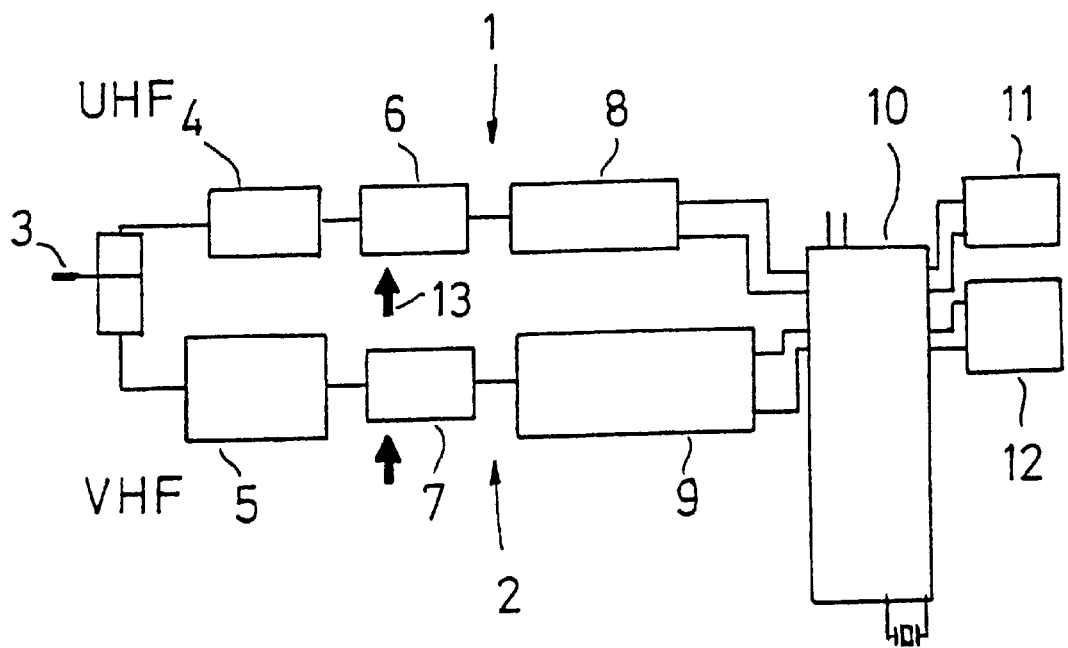
FIG. 5 is a block diagram of a television tuner with a prior art two-band preliminary stage circuit.

Components that correspond to those used in the above description of FIG. 5 will be identified with the same reference symbols in the following description.

Figure 1:
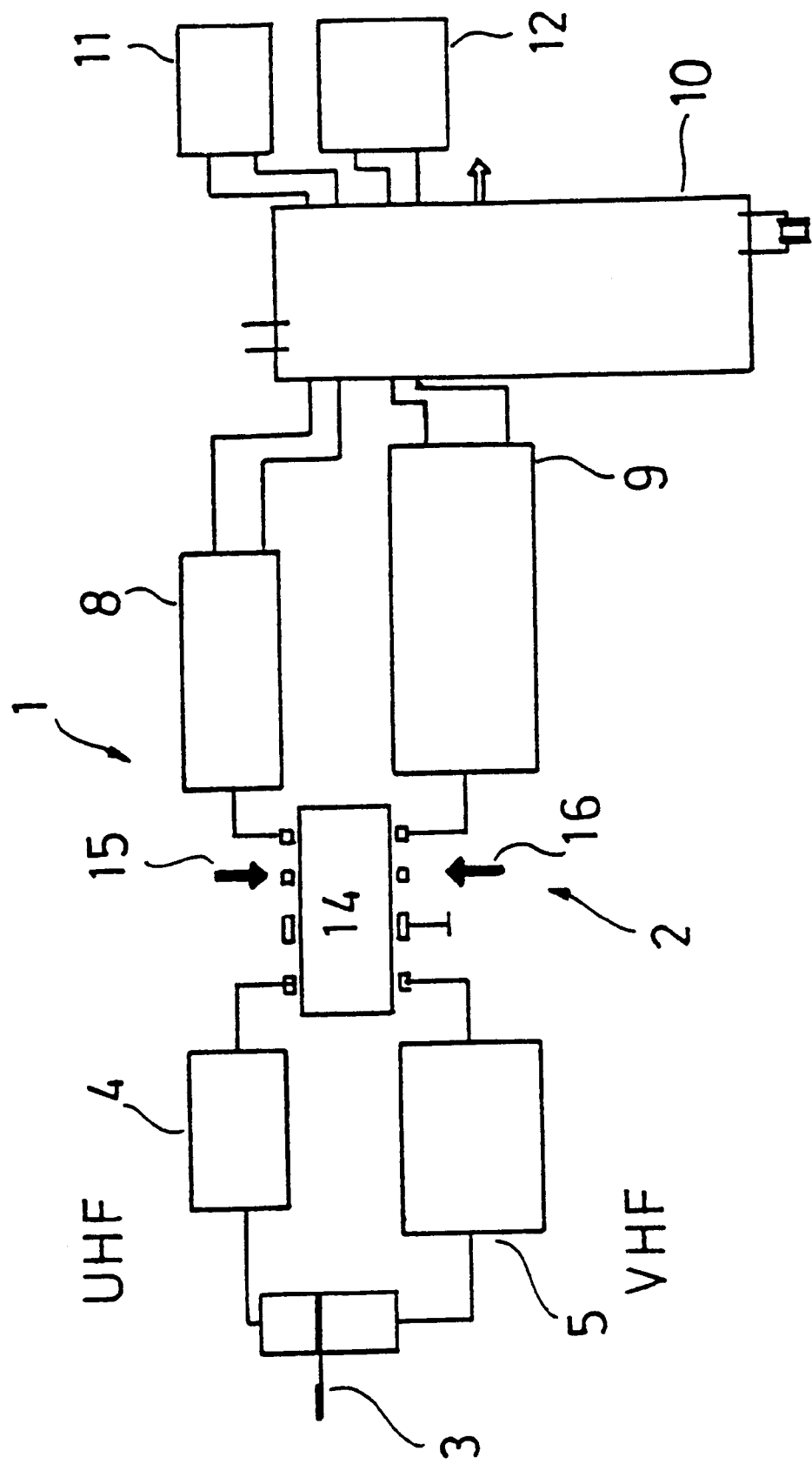
FIG. 1 is a block diagram of a television tuner with the multiple preliminary stage circuit according to the invention.

Referring now to the figures of the drawing in detail and first, particularly, to FIG. 1 thereof, the two amplifier stages 6 and 7 in the multiple preliminary stage circuit according to the invention of the existing preliminary stage circuit are integrated with an amplifier stage 14, which is accommodated in a chip with an SMD housing. A band switching signal (arrow 15) and an amplification control signal-(arrow 16) could be fed to the amplifier stage 14. The desired band, i.e., the UHF band 1 or the VHF band 2 can be engaged with the band switching signal (arrow 15), whereas the amplification is adjusted with the amplification control signal 16.

Figure 2:
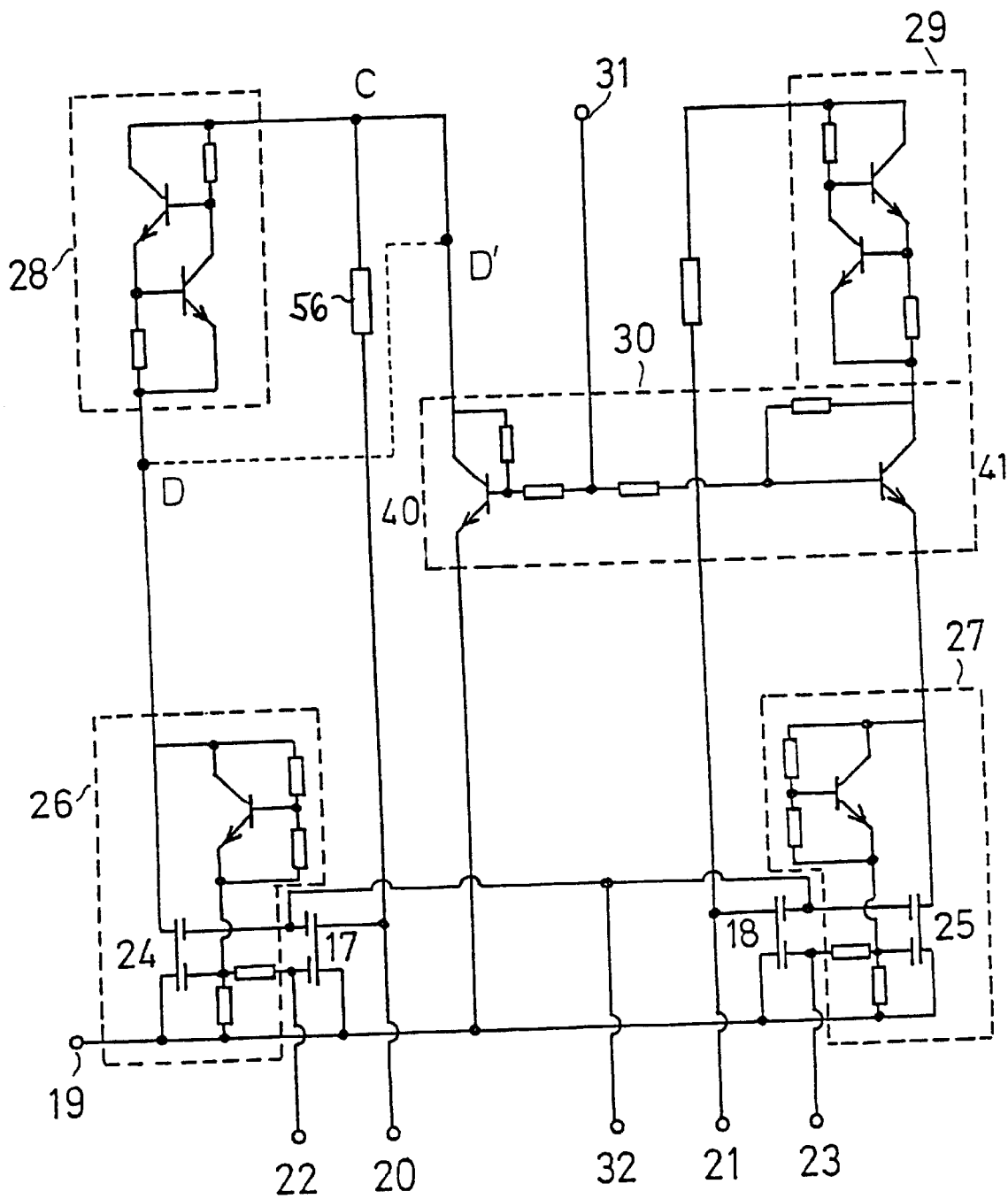
FIG. 2 is a circuit schematic of a first exemplary embodiment of the preliminary stage circuit according to the invention.

FIG. 2 shows the design of the amplifier stage 14 in detail. As in the prior art two-band preliminary stage circuit, the amplifier stage 14 also has amplifier MOS-FETs 17, 18 similar to the amplifier stage 6 of the amplifier stage 7, whose source-drain zones lie between a reference potential 19 and a first or second output 20 or 21. The first gate of the amplifier MOS-FETs 17 and 18 is connected to a first or second input 22 or 23.

In the mirror circuit to the amplifier MOS-FET 17 and 18 a corresponding reference transistor 24 or 25 is present, which is dimensioned much smaller than the amplifier MOS-FETs 17 and 18. For example, if a current of 10 mA flows through the amplifier MOS-FET 17, the reference transistor 24 conducts a current of only, say, 0.1 mA.

The auxiliary elements 26, 27 and current source circuits 28, 29 are connected upline of reference transistors 24 and 25. The current source circuits 28, 29 supply the amplifier MOS-FETs 17 and 18 via the reference transistors 24 and 25 in the current mirror circuit. This arrangement serves for operating point adjustment.

A switching logic 30, to which the switching signal can be fed via a terminal 31, serves for switching between the two bands or between the first input 22 and the first output 20, on the one hand, and the second input 23 and the second output 21, on the other. This switching logic 30, in particular, has two transistors 40, 41, which are switched so that they can allow only one amplifier MOS-FET or one band to be active. The controlled section of the first transistor 40 connects the terminal on the input side of the first current source circuit 28 to the reference potential 19 at a connection point C that also lies at a first output 20 via a resistance 56. The collector and base of the transistors 40, 41 are also connected.

The second gate of the amplifier MOS-FETs 17 or 18 is connected to a terminal 32 for the amplification control signal.

The switching logic is laid out so that the switching signal fed at terminal 31 can be driven by a switching element with an open collector output. The signal at such an open collector output is known to be zero volt in the "closed" state of the switching element. In the "open" state of the switching element the output is high-resistance.

The switching logic operates as follows. When terminal 31 is exposed to zero volt, zero volt is accordingly applied to both control inputs of transistors 40, 41, which are together connected to terminal 31 and both transistors 40 and 41 are blocked. This means that the signal at the connection point C on the input side of the first current source circuit 28 is active and the first current source circuit 28 loads the first working point adjustment circuit 24.

Since the second transistor 41 lies at the output of the second current source circuit 29, it interrupts the connection between the second current source circuit 29 and the second operating point adjustment circuit 25 when zero volt is present on terminal 31. The first auxiliary element 26 therefore operates and the second auxiliary element 27 is inactive.

Switching occurs on the terminal 31 as high-resistance. The first and second transistors 40, 41 are then conducting. On the one hand, this means that the terminal point C on the input side of the first current source circuit 28 is shorted via the control zone of the first transistor 40 and the first current source circuit is therefore disconnected. The first auxiliary element 26 is therefore also inactive.

On the other hand, the second transistor 41 produces connection of the second current source circuit 29 to the reference transistor 25 of auxiliary element 27 so that this is active.

As an alternative to the connection depicted in FIG. 2 of the first transistor 40 of switching logic 30 to the terminal point C on the input side of the first current source circuit 28, disconnection of the first auxiliary element 26 could also occur by connection of output D of the first current source circuit 28 to the controlled section of the first transistor 40, as shown by the dashed line C–C'.

Figure 3:
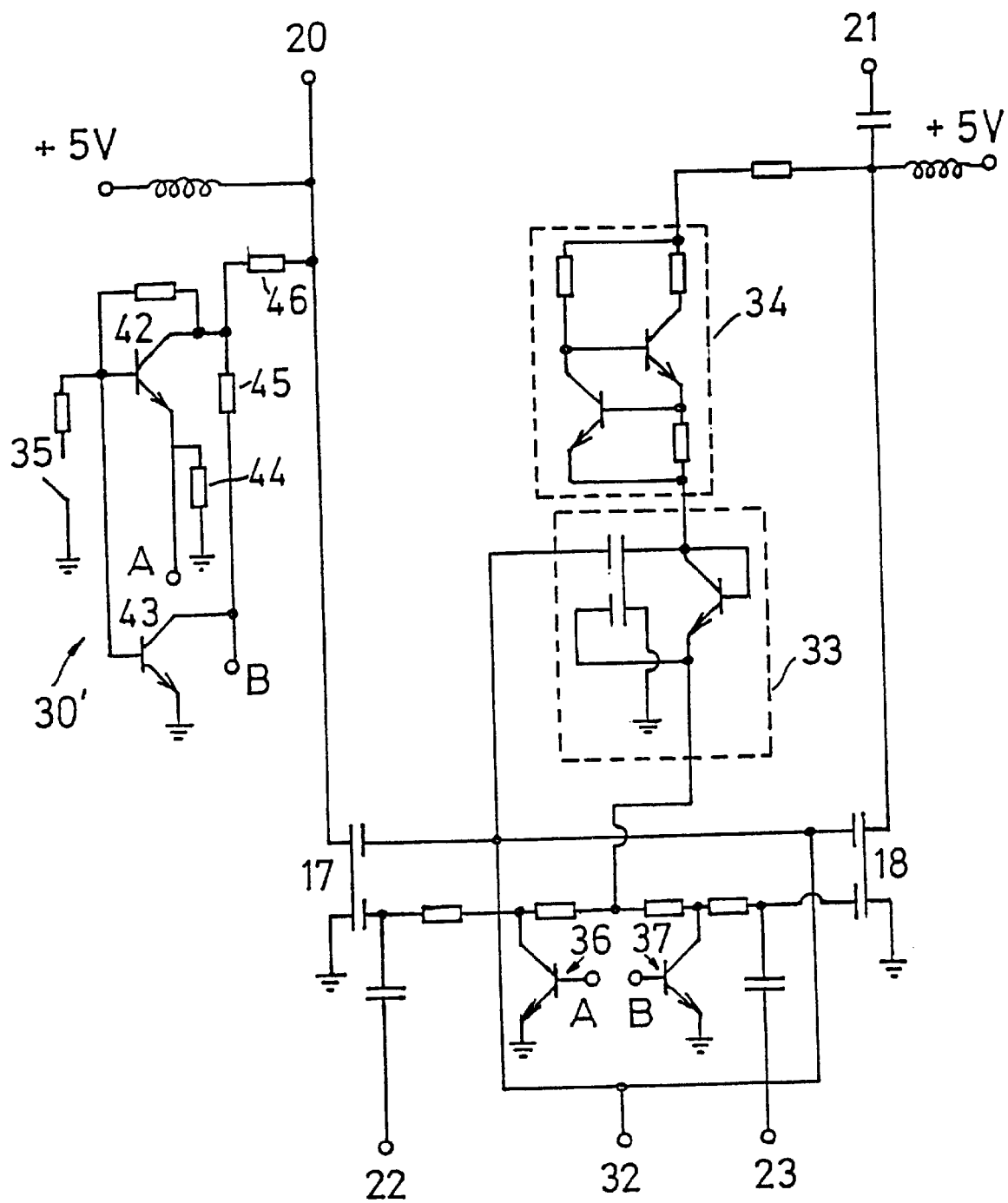
FIG. 3 is a circuit schematic of a second exemplary embodiment of the preliminary stage circuit according to the invention.
Figure 4:
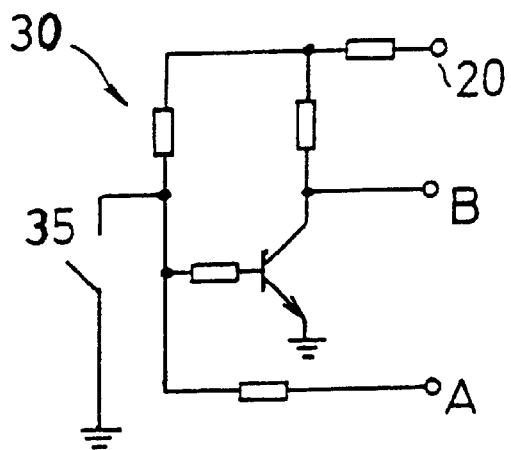
FIG. 4 is a schematic diagram of a switching logic for the exemplary embodiment of FIG. 3.

Two operating point adjustment circuits 24, 26, 28 or 25, 27, 29 are therefore present in the exemplary embodiment of FIG. 2. It would now be desirable if these operating point adjustment circuits could be combined in one circuit. A exemplary embodiment of this is shown in FIGS. 3 and 4. FIG. 4 shows a variant of the upper left circuit part of the circuit of FIG. 3. The terminal points "A" and "B" are to be connected to the terminal points "A" and "B" on the bases of the bipolar transistor.

In the circuit of FIG. 3 a tetrode with auxiliary element 33 is assigned to both amplifier MOS-FETs 17 and 18 as reference transistor, which is connected upline of current source 34. The switching logic 30 to which the bipolar transistors 36 and 37 also belong, is controlled by a switching signal 35 that connects or disconnects the corresponding amplifier MOS-FETs 17 or 18 with its channel.

Switching of the circuit according to FIG. 3 operates as follows. When a zero volt signal is present on the open collector output 35, the transistor 42 is conducting and the terminal A of transistor 42 causes switching of bipolar transistor 36. This means that the voltage lying on the amplifier MOS-FET 17 is shorted.

On the other hand, with transistor 43 switched, the terminal point B lies at zero volt, which means that the bipolar transistor 37 is blocked so that the amplifier MOS-FET 18 is supplied by the auxiliary element 33.

Both transistors 42, 43 are blocked at the open input on switch 35. Terminal A is then set at zero volt via resistance 44, whereas terminal B is supplied with the operating voltage at +5 V via resistances 45, 46. This means that the two bipolar transistors 36, 37 behave precisely opposite to the stage described previously, i.e., the bipolar transistor 36 is blocked and the bipolar transistor 37 is conducting, which leads to switching between amplifier MOS-FETs 17, 18.

The variant of FIG. 4 is characterized by the fact that it requires one transistor fewer than the variant of FIG. 3.

Figure 6:
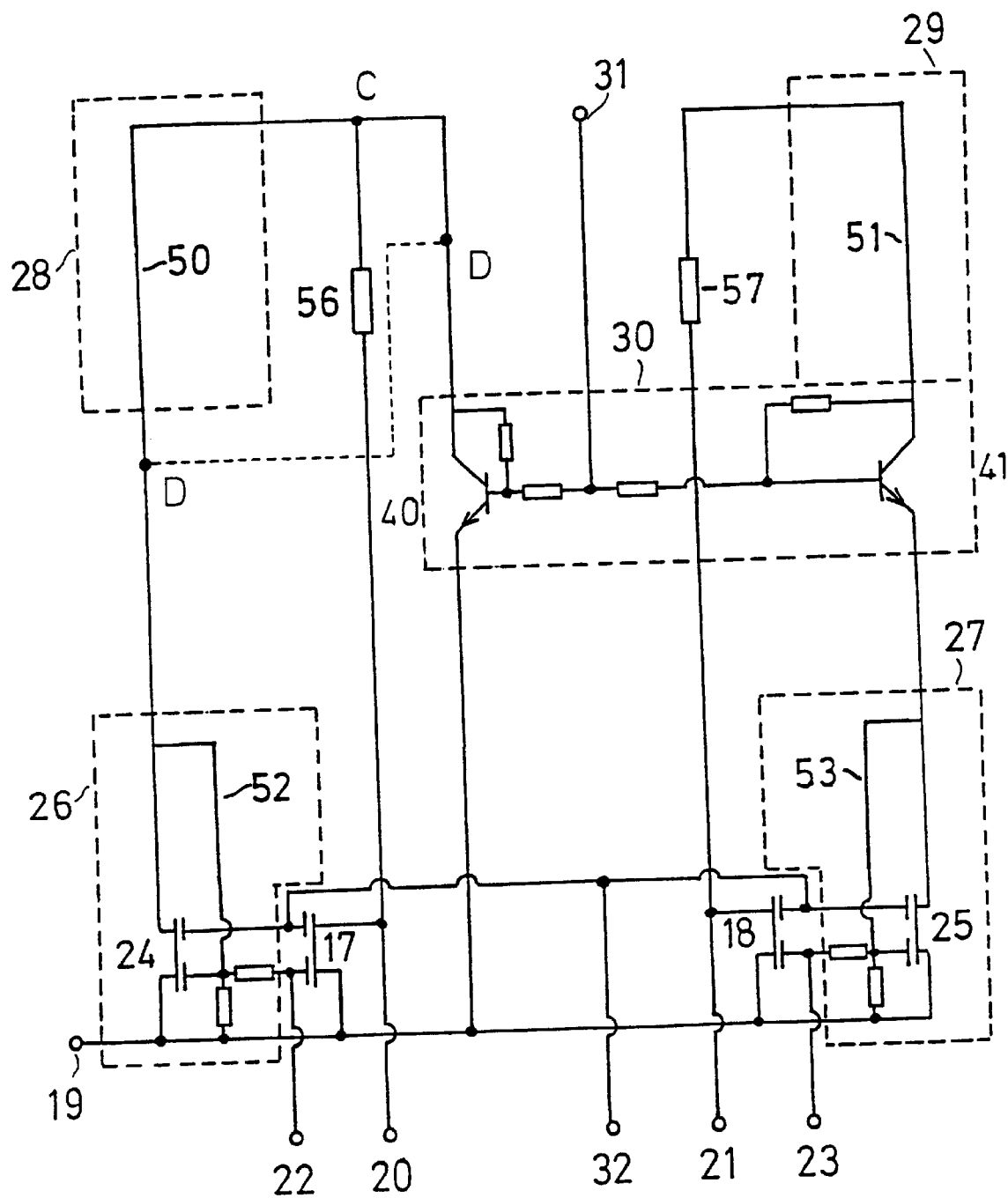
FIG. 6 is a circuit schematic of a further variant of the exemplary embodiment of FIG. 3.

In the exemplary embodiment depicted in FIG. 6 the same parts are provided with the same reference numbers as in FIG. 2. The circuit differs from the example according to FIG. 2 in that the first current source arrangement 28 consists only of a line 50 that bridges the terminal points C, D, which together with resistance 56 between the input 20 and the terminal point C has the function of the current source. In the same manner, the input and output of the second current source arrangement 29 are bridged by a line 51, which acts as current source with the resistance 57 in the line between output 21 and the input of the current source arrangement 29.

Bridges 52 and 53 are also present in the auxiliary elements 26, 27, which connect the input and output of the reference transistors 24, 25 in the manner depicted in detail.

Figure 7:
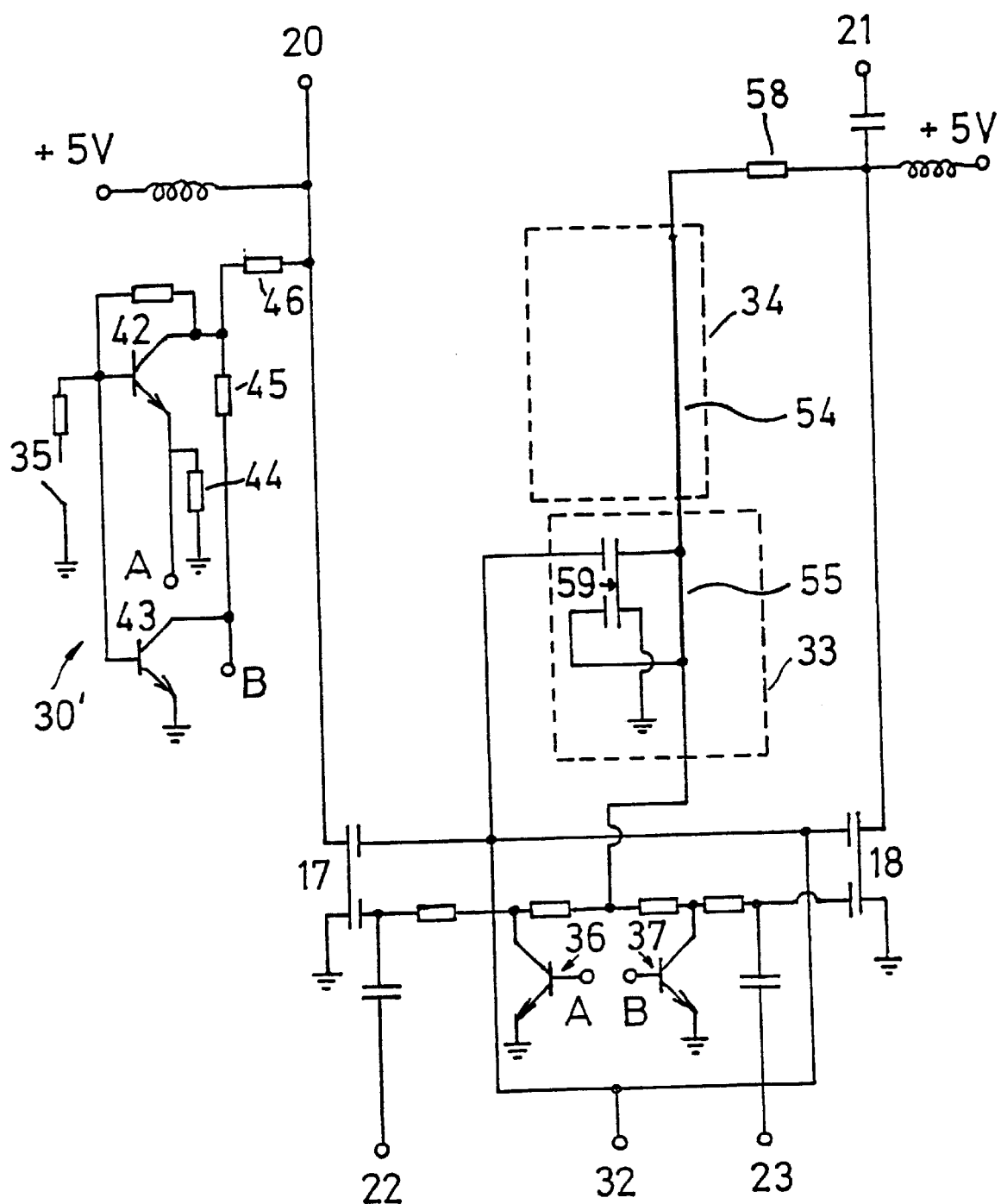
FIG. 7 is a circuit schematic of a further variant of the exemplary embodiment of FIG. 4.

In the exemplary embodiment depicted in FIG. 7, which corresponds to the example of FIG. 3 except for the difference described below, the current source 34 consists of a line 54 that bridges an input and output, which has the current source function with an upline resistor 58.

In auxiliary element 33 the input and output of the reference transistor 59 are bridged by a line 55 in the manner shown in detail.

Instead of the tetrodes just described, switching elements with a higher number of control inputs can also be used as an alternative, for example, pentodes. MOS-FETs can also be used instead of the bipolar transistors just described.

We claim:

1. A multiple preliminary stage circuit for a television tuner, comprising:

a first band with a first band amplifier stage having a transistor and a second band with a second band amplifier stage having a transistor;

a common chip common to said first band and said second band and having integrated therein said first band amplifier stage and said second band amplifier stage;

said common chip having a terminal for receiving a band switching signal and a terminal for receiving an amplification control signal;

a tuner-IC connected to said common chip for switching, with a single band switching signal, said first and second amplifier stages;

a reference transistor connected to a respective transistor of a respective said amplifier stage to form a current mirror circuit; and a further transistor having a controlled section connected between said reference transistor and a reference potential for selectively blocking said controlled section of said reference transistor or connecting said controlled section through to the reference potential in dependence on the band switching signal, and wherein the respectively other amplifier stage is selectively activated and deactivated in complementary fashion via the band switching signal.

2. The circuit according to claim 1, wherein a reference transistor of the respectively other amplifier stage is shorted to the reference potential.

3. The circuit according to claim 1, wherein said amplifier stages each have control inputs shorted to the reference potential.

4. The circuit according to claim 1, wherein said common chip further comprises at least one operating point adjustment circuit and a switching logic.

5. The circuit according to claim 4, wherein said at least one operating point adjustment circuit comprises a current source, an auxiliary element, and said reference transistor in said current mirror circuit for said corresponding amplifier stage.

6. The circuit according to claim 1, which further comprises an SMD housing enclosing said common chip.

* * * * *

UNITED STATES PATENT AND TRADEMARK OFFICE
CERTIFICATE OF CORRECTION

PATENT NO. : 6,452,645 B1
DATED : September 17, 2002
INVENTOR(S) : Ralph Kuhn and Lothar Musiol It is certified that error appears in the above-identified patent and that said Letters Patent is hereby corrected as shown below:

<u>Title page,</u>
Item [30], should read as follows:

--          Foreign Application Priority Data

Sep. 30, 1996      (DE) ...............................196 40 216.6 --

Signed and Sealed this

Seventeenth Day of December, 2002

JAMES E. ROGAN
*Director of the United States Patent and Trademark Office*